US006391741B1

(12) United States Patent
Mastromatteo et al.

(10) Patent No.: US 6,391,741 B1
(45) Date of Patent: May 21, 2002

(54) FABRICATION PROCESS FOR MICROSTRUCTURE PROTECTION SYSTEMS RELATED TO HARD DISK READING UNIT

(75) Inventors: Ubaldo Mastromatteo, Bareggio; Sarah Zerbini, Fontanellato; Simone Sassolini, Sansepolcro; Benedetto Vigna, Pietrapertosa, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/616,227

(22) Filed: Jul. 14, 2000

(30) Foreign Application Priority Data

Jul. 15, 1999 (EP) .............................................. 99830449

(51) Int. Cl.[7] .......................... H01L 21/76; H01L 21/46
(52) U.S. Cl. ...................... 438/455; 438/459; 438/460; 438/464; 438/689; 438/706; 438/723
(58) Field of Search ........................ 73/504.09, 514.22, 73/514.23, 514.32, 514.36; 216/2; 257/254, 417, 418, 420; 310/90, 309; 359/198, 199, 212–214, 221, 223, 224, 226, 230; 360/97.01, 99.06, 99.08; 384/2–6; 438/50, 52, 455, 456, 458, 459, 460, 464, 481, 488, 593, 689, 704, 706, 712, 723

(56) References Cited

U.S. PATENT DOCUMENTS

| 5,614,742 | A |   | 3/1997 | Gessner et al. ............. 257/254 |
| 5,882,532 | A |   | 3/1999 | Field et al. ..................... 216/2 |
| 6,087,747 | A | * | 7/2000 | Dhuler et al. ................. 310/90 |
| 6,198,145 | B1 | * | 3/2001 | Ferrari et al. ............... 257/415 |
| 6,256,134 | B1 | * | 7/2001 | Dhuler et al. ............... 359/212 |

FOREIGN PATENT DOCUMENTS

| DE | 19602318 C1 | 8/1997 |
| EP | 0317084 A2 | 5/1989 |
| EP | 0913921 A1 | 5/1999 |

OTHER PUBLICATIONS

T.C. Reiley et al., "Micromechanical Structures for Data Storage", Elsevier Science B.V., 1995, pp. 495–498.
Denny K. Miu et al., "Silicon Micromachined SCALED Technology", IEEE Transactions on Industrial Electronics, New York, Jun. 1995, vol. 42, No. 3, pp. 234–239.

* cited by examiner

*Primary Examiner*—Charles Bowers
*Assistant Examiner*—Asok Kumar Sarkar
(74) *Attorney, Agent, or Firm*—Lisa K. Jorgenson; E. Russell Tarleton; Seed IP Law Group PLLC

(57) ABSTRACT

A process for assembling a microactuator on a R/W transducer that includes forming a first wafer of semiconductor material having a plurality of microactuators including suspended regions and fixed regions separated from each other by first trenches; forming a second wafer of semiconductor material comprising blocking regions connecting mobile and fixed intermediate regions separated from each other by second trenches; bonding the two wafers so as to form a composite wafer wherein the suspended regions of the first wafer are connected to the mobile intermediate regions of the second wafer, and the fixed regions of the first wafer are connected to the fixed intermediate regions of the second wafer; cutting the composite wafer into a plurality of units; fixing the mobile intermediate region of each unit to a respective R/W transducer; and removing the blocking regions. The blocking regions are made of silicon oxide, and the intermediate regions are made of polycrystalline silicon.

17 Claims, 7 Drawing Sheets

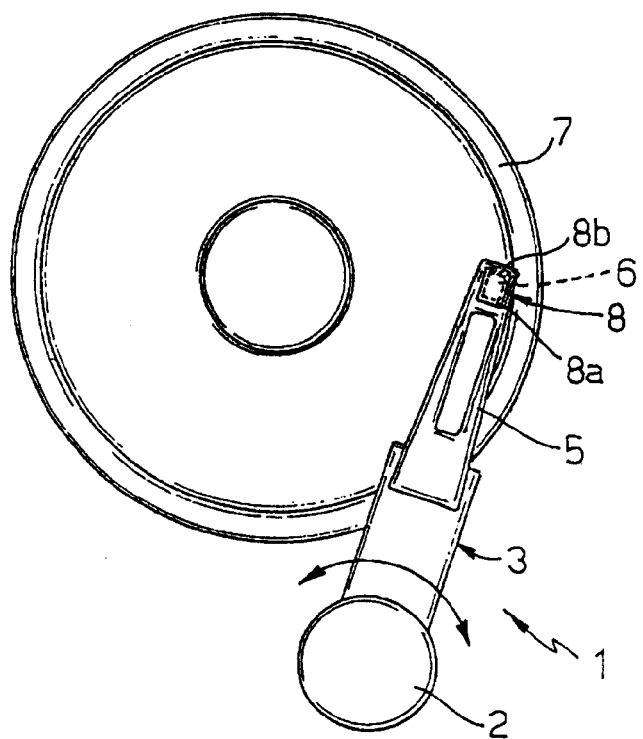
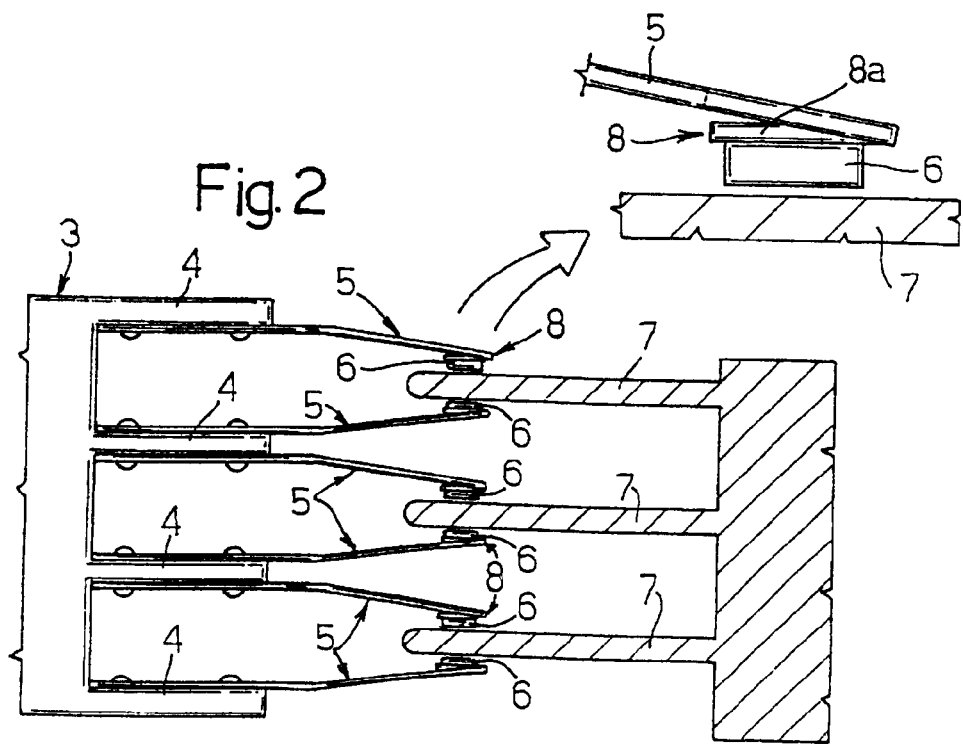

US 6,391,741 B1

FABRICATION PROCESS FOR MICROSTRUCTURE PROTECTION SYSTEMS RELATED TO HARD DISK READING UNIT

TECHNICAL FIELD

The present invention relates to a process for assembling a group of elements comprising at least one first element and one second element, one of the elements comprising a microstructure without package.

BACKGROUND OF THE INVENTION

As is known, hard disks are the most commonly used data storage solution; consequently they are produced in very large volumes, and the maximum density of data storage is increasing year by year. Hard disks are read and written by actuator devices, the general structure whereof is shown in FIGS. 1 and 2, and is described hereinafter.

In particular, FIG. 1 shows an actuator device 1 of known rotary type, which comprises a motor 2 (also known as a voice coil motor) secured to a support body 3 which is generally known as E block, owing to its "E" shape in lateral view (see FIG. 2). The support body 3 has a plurality of arms 4 which each support a suspension 5 formed by a cantilevered plate. At its end not connected to the support body 3, each suspension 5 supports a R/W transducer 6 for reading/writing, which in an operative condition is disposed facing a surface of a hard disk 7, so as to perform roll and pitch movements in order to follow the surface of the hard disk 7. To this end, R/W transducer 6 (which is also called picoslider or slider) is bonded to a coupling called gimbal or flexure 8, which is generally formed from the suspension 5 and comprises for example a rectangular plate 8a, cut on three and a half sides from the plate of the suspension 5, and having a portion 8b connected to the suspension 5 and allowing bending of plate 8a caused by the weight of the R/W transducer 6 (see FIG. 3).

For increasing the data storage density, it has been already proposed to use a double actuation stage, with a rougher first actuation stage, including the motor 2 moving the assembly formed by the support body 3, the suspension 5 and the R/W transducer 6 across the hard disk 7 during coarse search of the track, and a second actuation stage performing a finer control of the position of the R/W transducer 6 during tracking. According to a known solution, the second actuation stage comprises a microactuator interposed between the R/W transducer 6, as shown in FIG. 3, which shows exploded the end of the suspension 5, the gimbal 8, the R/W transducer 6 and a microactuator 10, in this case of the rotary type. The microactuator 10 is controlled by a signal supplied by control electronics, on the basis of a tracking error.

The microactuator 10 comprises fixed parts and suspended mobile parts. In particular, the latter, during assembly of the R/W transducer on the microactuator and when forming connections with the control circuitry, may be displaced and/or may collapse. In addition, stresses may be set up in the structure of the microactuator, such as to cause fragility of the structure.

In order to keep the final assembly process similar to those used before the introduction of a dual actuation stage and at the same time prevent displacement and collapse, systems for protecting the microactuator have been proposed, which, however, are complex and consequently costly.

SUMMARY OF THE INVENTION

The disclosed embodiments of the invention provide an assembly process that enables protection of microstructures when assembled on other components in a less complex and more inexpensive way.

According to the embodiments of the present invention, a process for assembling a group comprising at least one first and one second element and a unit thus assembled are provided, including a microstructure without package, the process comprising: forming a first wafer of semiconductor material having a plurality of microstructures including first and second operating regions separated from each other by first trenches; forming a second wafer of semiconductor material comprising blocking regions connecting a plurality of first and second intermediate regions, the first and second intermediate regions separated from each other by second trenches; joining the first wafer and second wafer to form a composite wafer wherein the first operating regions are fixed to the first intermediate regions and the second operating regions are fixed to the second intermediate regions; cutting the composite wafer into a plurality of units, each unit including at least one first operating region and one second operating region, and one first intermediate region and one second intermediate region; fixing the first intermediate region of at least one unit to the second element; and removing the blocking regions.

BRIEF DESCRIPTION OF THE DRAWINGS

For a better understanding of the present invention, a preferred embodiment thereof is now described, purely to provide a non-limiting example, with reference to the attached drawings, wherein:

FIG. 1 shows a top view of an actuator for hard disks, of a known type;

FIG. 2 is an enlarged side view of certain parts of the actuator of FIG. 1;

DETAILED DESCRIPTION OF THE INVENTION

Figure 3:
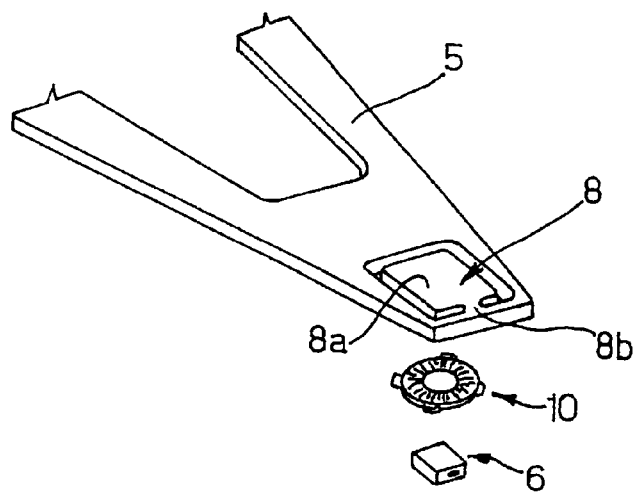
FIG. 3 is an exploded view of the micrometric actuation unit in an actuator device having dual actuation stage.

In the ensuing description, reference will be made to the process of assembling a microactuator 10 on the slider 6 and on the suspension 5, as shown in FIG. 3. For this purpose, in a first semiconductor material wafer, the microactuators and the corresponding control circuits are first formed (for example, as described in the European Patent Application EP-A-0 913 921).

Figure 4:
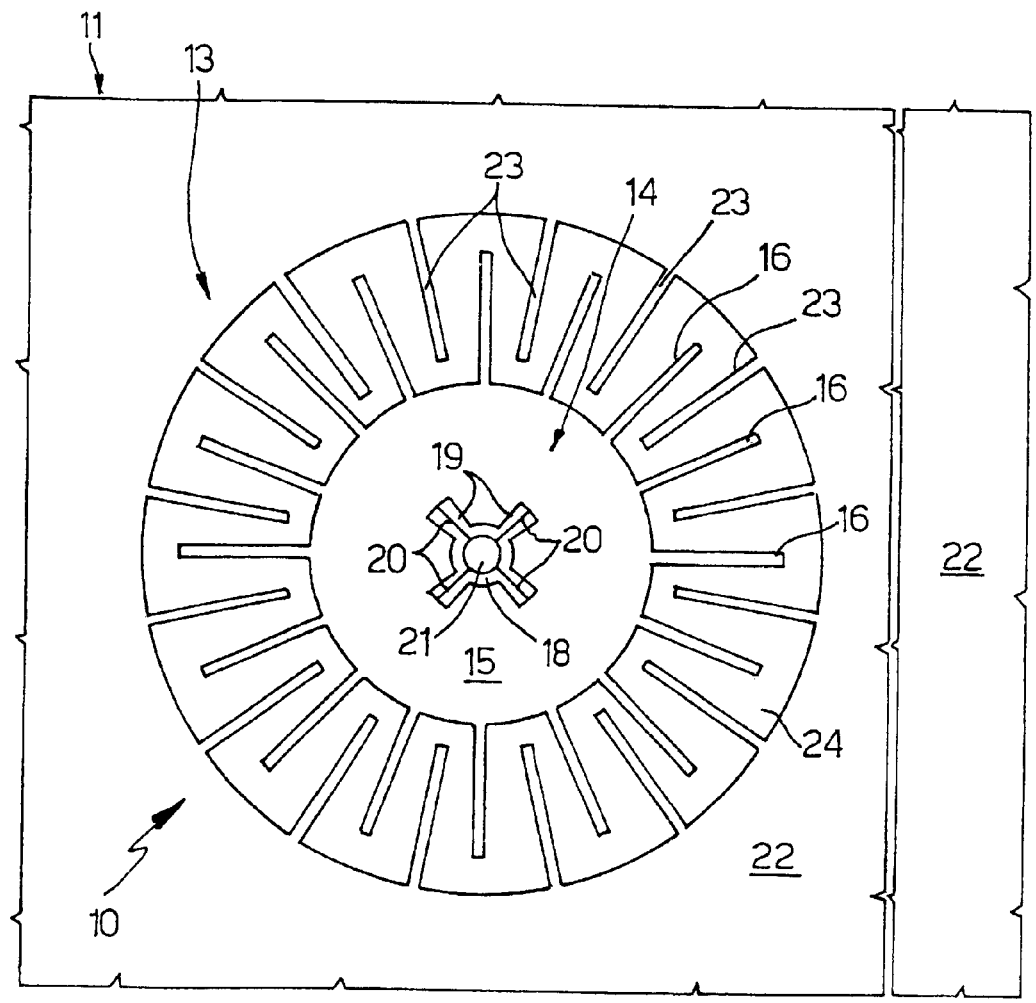
FIG. 4 is a simplified top view of a semiconductor material wafer housing a microactuator of the rotational type.

For a better understanding of the invention, in FIG. 4 a first semiconductor material wafer 11 is shown, wherein a plurality of microactuators 10 is formed, only one of which is shown as regards its essential elements. The microactuator 10 comprises an external stator 13, designed to be rigidly connected to the plate 8a of the gimbal 8 (FIG. 3), and an internal rotor 14 capacitively coupled to the stator 13 and designed to be bonded to the R/W transducer 6 (FIG. 3).

The rotor 14 comprises a suspended mass 15 of a substantially annular shape and a plurality of mobile arms 16 extending radially outwards starting from the suspended mass 15.

The suspended mass 15 surrounds concentrically an anchoring region 21, which is fixed and is separated from the suspended mask 15 by an annular trench 18 connected to four radial slots 19, which extend radially inside the suspended mass 15. Four elastic suspension and anchoring elements, hereinafter called springs 20, extend between the anchoring region 21 and the suspended mass 15 inside the radial slots 19. The springs 20 have the function of elastically and electrically connecting the suspended mass 15 to the anchoring region 21. The anchoring region 21, which is of a cylindrical shape, thus has the function of supporting and biasing the mobile mass 15 and the mobile arms 16 of the rotor 14 through a buried conductive region (not shown in detail).

The stator 13 comprises a fixed region 22, surrounding the area housing the rotor 14, and a plurality of fixed arms 23, which extend radially from the fixed region 22 and are arranged so that they alternate with the mobile arms 16. The mobile arms 16 and the fixed arms 23 are separated from one another by a trench 24 which extends in zigzag fashion annularly between the fixed region 22 and the suspended mass 15. The fixed region 22 houses biasing regions for the rotor 14 and the stator 13, components of the control circuitry, as well as the connections between the microactuator and the control circuitry, in a per se known manner, and hence are not shown.

According to this embodiment of the invention, a second wafer 25 is made which houses a plurality of supporting and protective structures, one for each microactuator 10 present in the first wafer 11. The second wafer 25 is bonded to the wafer 11 so as to support and protect the microactuators 10 during cutting of the wafer 11 and bonding to the slider 6 and to the gimbal 8.

Figure 5:
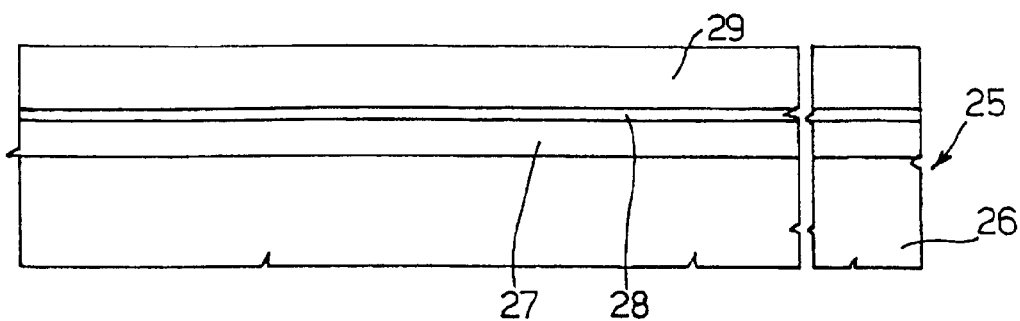
FIGS. 5 and 6 show cross sections through a silicon wafer housing a protective structure according to the invention in two successive fabrication steps.

To this end (FIG. 5), the second wafer 25 comprises a monocrystalline silicon substrate 26, a silicon oxide blocking layer 27 deposited or thermally grown, an insulation layer 28, for example made of silicon nitride, and a polycrystalline silicon layer 29. The substrate 26 has an initial thickness of 650–700 μm. The blocking layer 27, which has a function of mutually blocking the mobile parts and the fixed parts of the microactuators 10, as described hereinafter, preferably has a thickness of at least 0.5 μm. The insulating layer 28, which has the function of electrically insulating the polycrystalline silicon layer 29 from electrical connection regions, which are made subsequently, preferably has a thickness of approximately 90 nm. The polycrystalline silicon layer 29 is made preferably by depositing a polycrystalline silicon germ layer and performing an epitaxial growth until a total thickness of approximately 5 μm is obtained.

Figure 6:
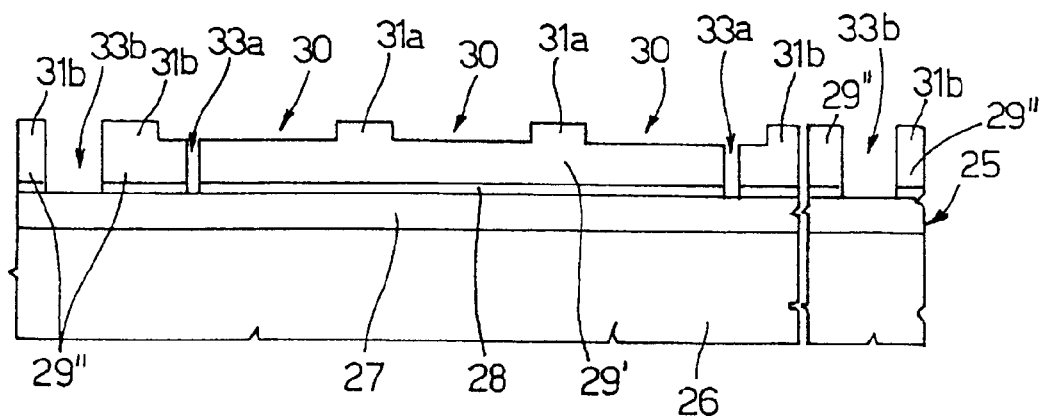

Subsequently, the polycrystalline silicon layer 29 is masked with resist mask and etched out to form cavities 30, having a thickness of between approximately 5 and 10 μm, separated by projections 31a and 31b (FIG. 6). The projections 31a, preferably with an annular shape, are each formed at a respective suspended mass 15 of the first wafer 11, while the projections 31b are each formed at a respective fixed region 22, as shown in FIG. 7 for a microactuator 10.

Next, the polycrystalline silicon layer 29 and the insulation layer 28 are masked with a resist mask and etched to obtain first trenches 33a and second trenches 33b, which extend up to the blocking layer 27. The first trenches 33a, which are narrower, have a preferably annular shape and are arranged so that each of them extends approximately along or near the circumference that externally delimits the region of the first wafer 11 which houses the respective rotor 14, this circumference separating the rotor 14 from the respective fixed region 22. The second trenches 33b, which are wider, are arranged along the scribing lines of the wafers 11 and 25. In a way not shown, trenches are also made at the contact pads of the first wafer 11. In this way, the polycrystalline silicon layer 29 forms mobile intermediate regions 29' and fixed intermediate regions 29", separated from each other by the first trenches 33a. In addition, the fixed intermediate regions 29" corresponding to adjacent microactuators 10 are separated from one another by the second trenches 33b.

Subsequently, the second wafer 25 is thinned out from the back in a mechanical way, for example by grinding the substrate 26, preferably until a total thickness of 300–400 μm is obtained.

Figure 7:
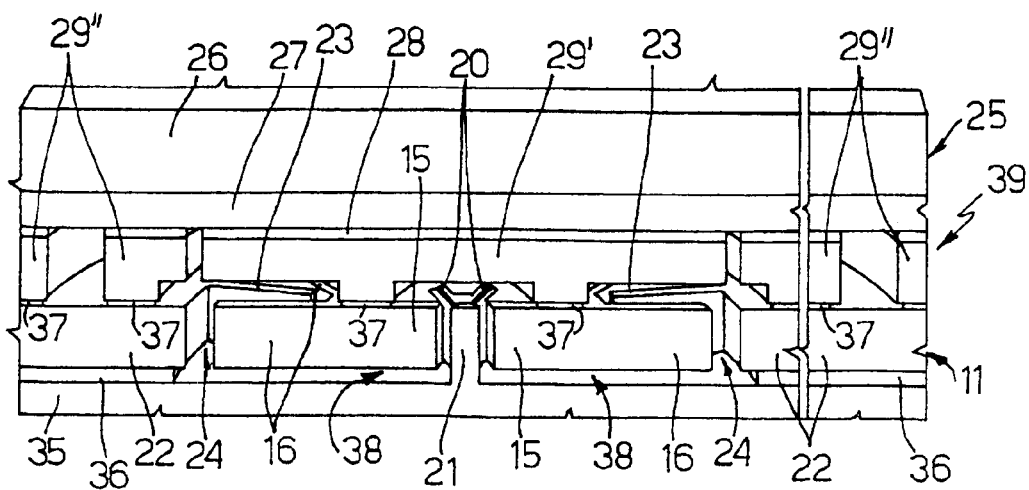
FIG. 7 is a perspective cross-sectional view of the wafer shown in FIG. 6, fixed to the silicon wafer of FIG. 4.

The second wafer 25 is then bonded to the first wafer 11 so that the projections 31a face the suspended masses 15, and the projections 31b face the fixed regions 22, as shown in FIG. 7, in which the reference number 35 designates a substrate region of the first wafer 11, from which the anchoring region 21 extends; number 36 designates insulating regions, for example of silicon oxide regions, which electrically separate the fixed region 22 from the substrate region 35, where necessary; number 37 designates the bonding material, and number 38 an air gap extending beneath the suspended mass 15 and the mobile arms 16.

Figure 8:
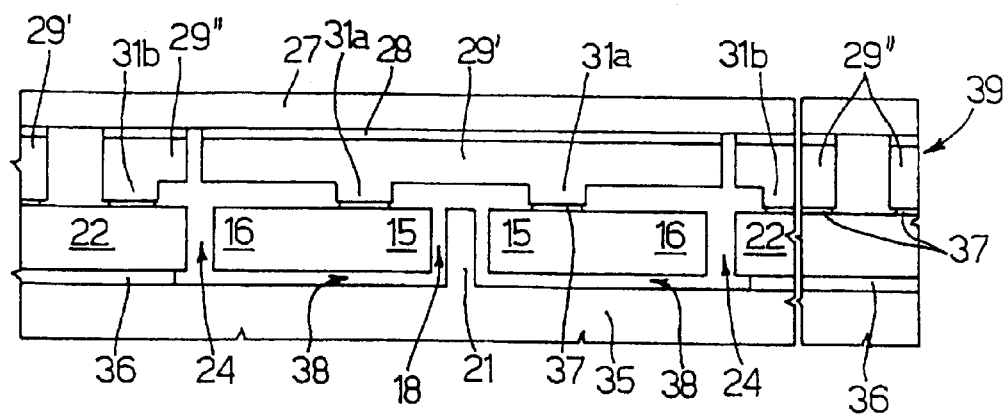
FIGS. 8–13 are cross sections of the structure obtained in successive fabrication steps.

In this way, a composite wafer 39 is obtained, which is subsequently mechanically thinned out, for example by grinding, so reducing the thickness of the substrate 26 of the second wafer 25 to approximately 30 μm. Then, the substrate 26 of the second wafer 25 is completely removed by wet etching or plasma etching, which is stopped at the blocking layer 27, as shown in FIG. 8.

The blocking layer 27 is then masked and etched so as to be removed completely from the areas where metallic regions of electrical connection are to be made and at the contact pads of the first wafer 11 (in a way not shown). In particular, of the blocking layer 27, blocking regions 27' remain at the trenches 33a and 33b and where the electrical connections for the slider are to be made. In this way, the blocking regions 27' form, together with the mobile intermediate regions 29' and fixed intermediate regions 29", a unitary protection and blocking structure, which completely covers all the microactuators 10 formed in the first wafer 11 and blocks the mobile parts, so preventing them from being displaced or from collapsing.

Figure 9:
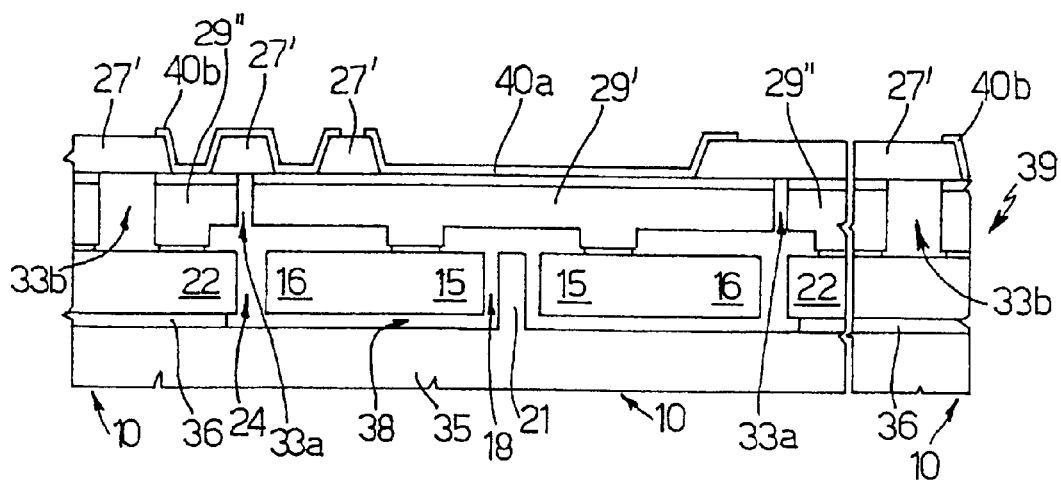

Next, on top of the insulating layer 28 and the regions 27' and 27", where these are present, a metallic multilayer is laid and defined (for example, formed by an aluminum layer and a gold layer) so as to obtain metallic regions 40a and connection lines 40b that extend partly on the insulating layer 28 and partly on the regions 27'. In particular, the metallic regions 40a extend approximately over the suspended masses 15, and the connection lines 40b each extend between a peripheral portion of the mobile intermediate region 29' and the portion, which faces the latter, of the respective fixed intermediate region 29", passing over the first trenches 33a, as shown in FIG. 9.

Figure 10:
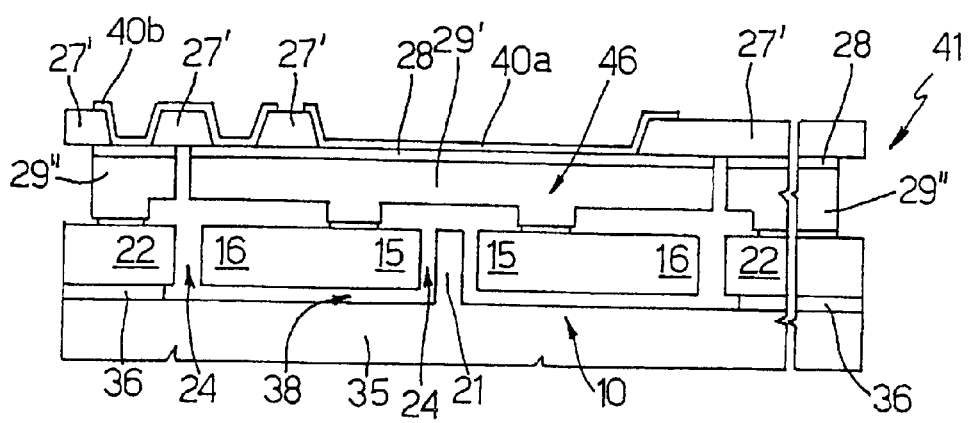

A test is then carried out on the composite wafer 39 in order to verify whether any short circuits are present. Next, the composite wafer 39 is cut into single units 41 at the trenches 33b, as shown in FIG. 10. In this step, the individual microactuators 10 are covered by the protective and blocking structure formed by the regions 29', 29" and 27', so that the operation of cutting will not damage the microactuators 10.

Figure 11:
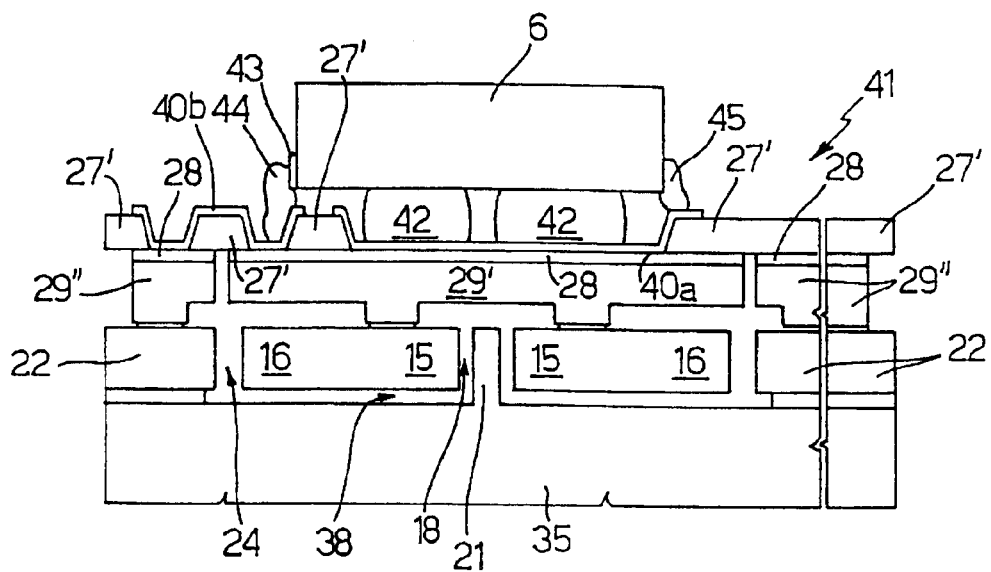

Subsequently (FIG. 11), a slider 6 is bonded on each unit 41. In particular, bonding material 42 is interposed between the metallic region 40a and the underside of the slider 6. Then, the connection lines 40b are bonded to contact pads 43 present on the slider 6 by means of conductive material 44, using, for example, a laser soft bonding technique, and the metallic region 40b is bonded to the body of the slider 6 by means of a conductive glue 45 so as to provide a ground connection for the slider 6.

Figure 12:
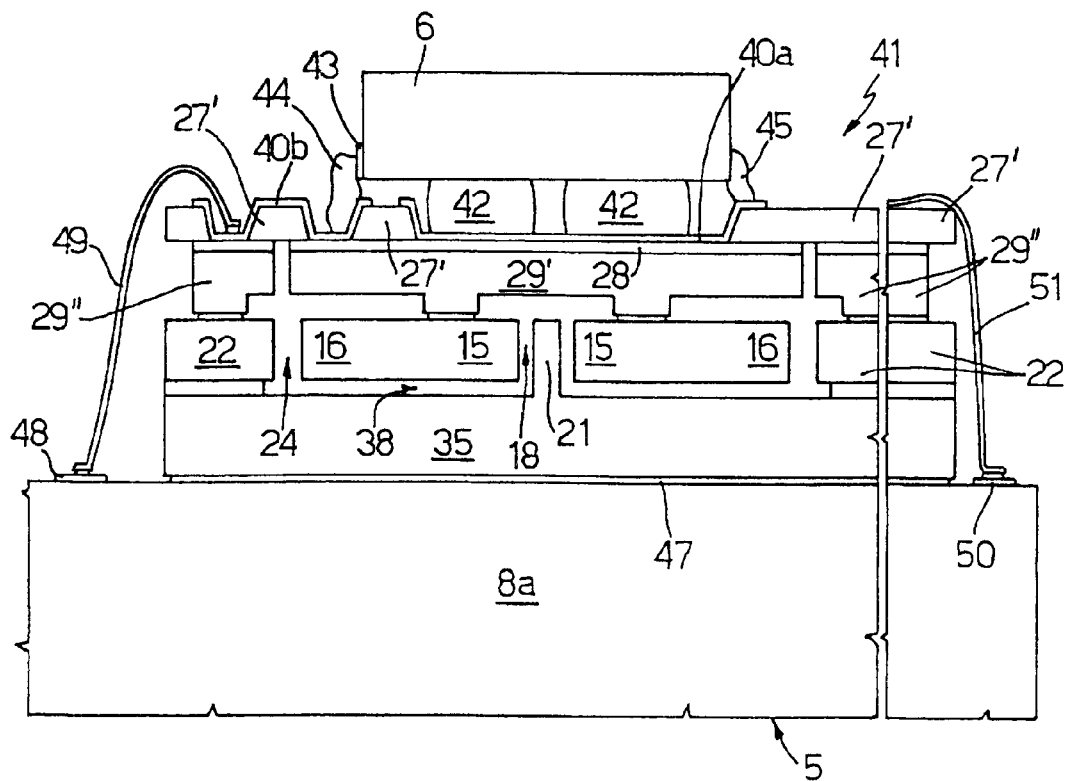

Next (FIG. 12), each unit 41 is bonded on a respective suspension 5 at the plate 8a using a bonding material 47. The connection lines 40b are electrically connected to respective contact pads 48 provided on the plate 8a by means of conductive wires 49, and the contact pads present on the first wafer 11 (not shown) are electrically connected to respective contact pads 50 provided on the plate 8a by means of electrical wires 51, which are visible only in part.

A test is carried out on the suspension/microactuator/slider units that have just been assembled. Then, in a not shown way, the assembled units are fixed to the supporting body 3.

Figure 13:
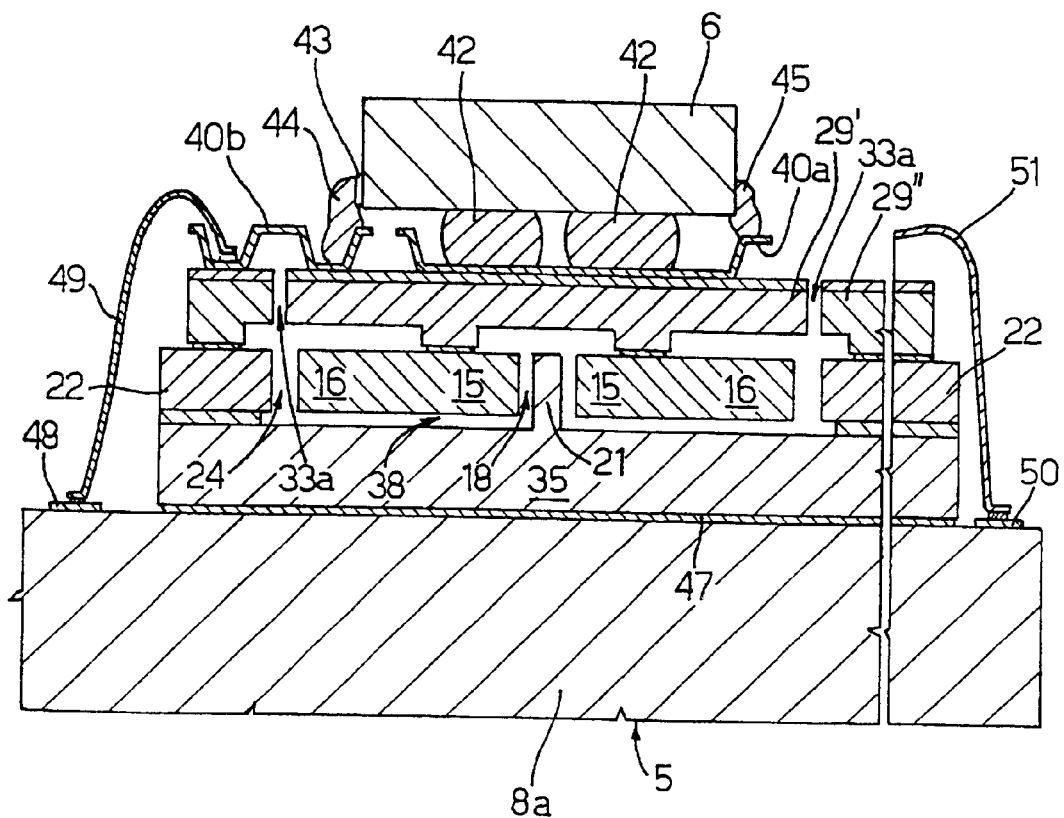
Figure 14:
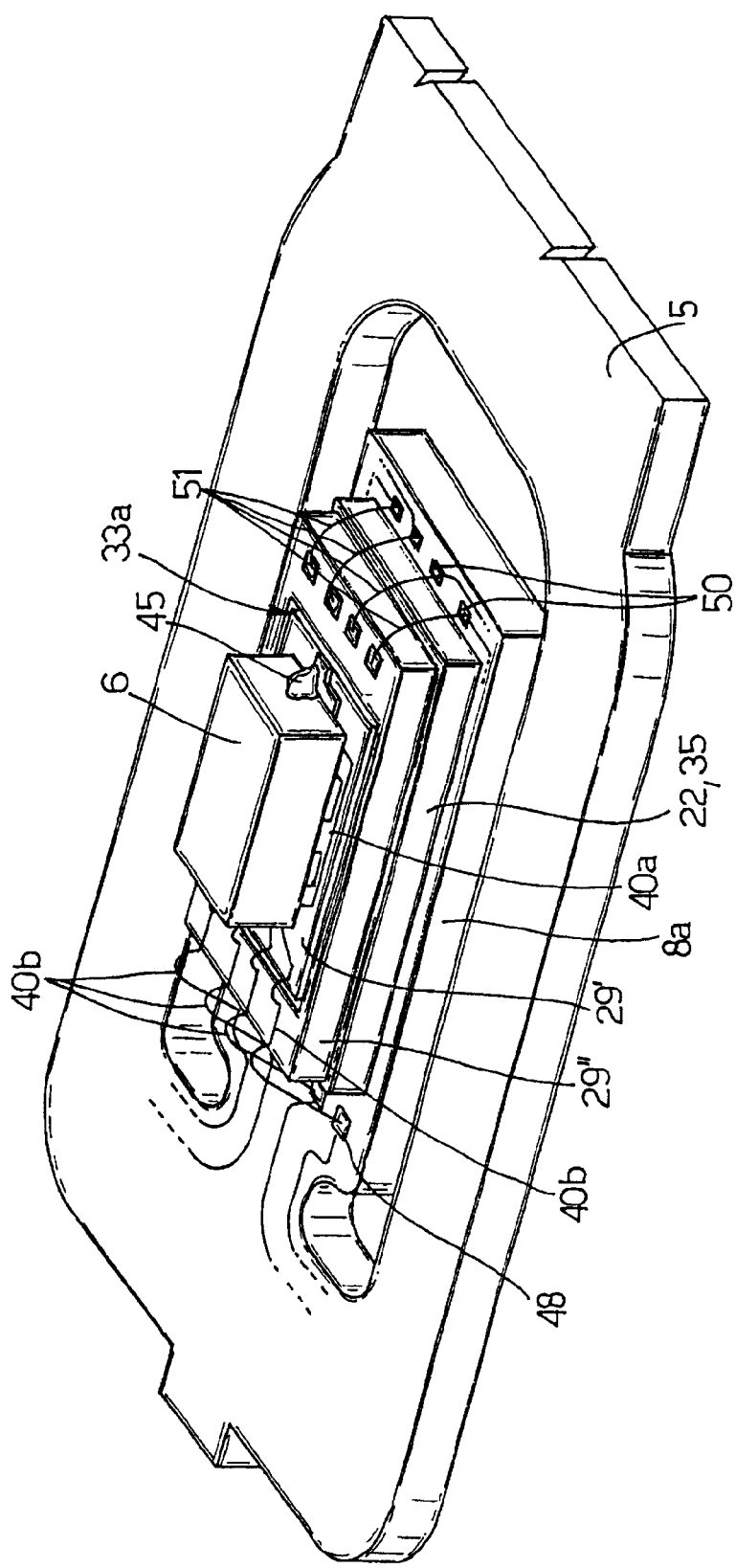
FIG. 14 is a perspective view of the obtained final group.

Finally, the blocking regions 27' are etched away using hydrofluoric acid gas to obtain the final structure shown in cross-sectional view in FIG. 13 and in perspective view in FIG. 14.

By removing the blocking regions 27', the mobile parts of the microactuator 10 (suspended mass 15 and mobile arms 16) and the slider 6, which is fixed to the aforesaid mobile parts through the mobile intermediate region 29', are free to move with respect to the fixed parts (fixed arms 23, fixed region 22 and fixed intermediate region 29"). The electrical connections 40 are free and have the necessary elasticity to enable rotation of the slider 6 with respect to the fixed intermediate region 29".

The advantages of the described process are the following: first, the process enables the unit made up of the microactuator 10 and the slider 6 to be assembled on the suspension 5 and enables the latter to be assembled on the supporting body 3 in a traditional way, as in standard actuator devices not having the microactuator 10. In addition, it provides a structure for protecting the microactuator 10 when cutting the wafer 11 and subsequently during assembly and bonding, thus reducing the risk of damage and collapse.

The described process comprises typical steps of microelectronics fabrication techniques, and hence has a high reliability and reproducibility, along with contained costs.

Finally, it is evident that numerous modifications and variations may be made to the process and unit described and illustrated herein, all falling within the scope of the invention, as defined in the attached claims. In particular, it is emphasized that the operations of electrical connection and joining of the various parts may be carried out according to any suitable technique. The microactuator may moreover be made of polycrystalline silicon or a metallic material, according to any known technique of fabrication.

The first step of reducing the thickness of the substrate 26 of the second wafer 25 may be omitted; however, this step is advantageous in order to reduce to a minimum the grinding time after bonding of the wafers 11 and 25, and consequently in order to reduce the risk of damage to the microactuators 10.

What is claimed is:

1. A process for assembling a group of elements having at least one first element and one second element, said first element including a microstructure without package, the process comprising:

forming a first wafer of semiconductor material comprising a plurality of microstructures including first and second operating regions separated from each other by first trenches, forming a second wafer of semiconductor material comprising blocking regions connecting a plurality of first and second intermediate regions, said first and second intermediate regions separated from each other by second trenches;

joining said first wafer and second wafer to form a composite wafer wherein said first operating regions are fixed to said first intermediate regions, and said second operating regions are fixed to said second intermediate regions;

cutting said composite wafer into a plurality of units, each unit including at least one first operating region and one second operating region, and one first intermediate region and one second intermediate region;

fixing said first intermediate region of at least one unit to said second element; and removing said blocking regions.

2. The process of claim 1 wherein forming a second wafer comprises forming at least one blocking layer, and after said joining, the process further comprises partially removing said blocking layer so as to form said blocking regions at least at said second trenches.

3. The process of claim 2 wherein forming a second wafer comprises:

forming a substrate of semiconductor material;

forming said blocking layer on top of said substrate;

forming a semiconductor layer on top of said blocking layer; and forming said second trenches in said semiconductor layer to obtain said first and second intermediate regions.

4. The process of claim 3, further comprising forming cavities in said semiconductor layer, said cavities delimiting projecting portions in said first and second intermediate regions, and wherein joining comprises bonding said projecting portions to said first and second operating regions.

5. The process of claim 3 wherein said substrate is made of polycrystalline silicon; and forming a blocking layer comprises forming a silicon oxide layer; and forming a semiconductor layer comprises epitaxially growing a polycrystalline silicon layer.

6. The process of claim 3, further comprising, before joining said first wafer and said second wafer, reducing the thickness of said substrate.

7. The process of claim 3, further comprising, before cutting, completely removing said substrate.

8. The process of claim 7 wherein completely removing said substrate comprises mechanically reducing the thickness of said substrate and subsequently completely etching said substrate.

9. The process of claim 8 wherein mechanically reducing is carried out by grinding, and completely etching is carried out by wet etching or plasma etching.

10. The process of claim 7, further comprising, before cutting, forming conductive regions extending over said blocking regions and said first and second intermediate regions.

11. The process of claim 10 wherein said conductive regions comprise electrical connection lines and metallic regions, said electrical connection lines extending over said blocking regions and said second trenches, and said metallic regions extending over said first intermediate regions; and wherein fixing comprises bonding said second element to a metallic region extending over said first intermediate region of said at least one unit.

12. The process of claim 10, further comprising, after said step of forming conductive regions, forming electrical connection structures between said second element and said conductive regions.

13. The process of claim 1, further comprising, before removing said blocking regions, fixing said unit to a supporting element.

14. The process of claim 13 wherein fixing said unit to a supporting element comprises bonding a substrate region of said first wafer to said supporting element.

15. The process of claim 14, further comprising, after said step of bonding, electrically connecting said second element and said first wafer to said supporting element.

16. The process of claim 1 wherein said blocking regions are made of silicon oxide and wherein removing said blocking regions comprises etching said silicon oxide in hydrofluoric acid gas.

17. The process of claim 1 wherein said unit belongs to a hard disk reading unit, said microstructure comprises a microactuator, and said second element comprises a read/write transducer.

\* \* \* \* \*